US007390699B2

(12) United States Patent
Ellwood

(10) Patent No.: US 7,390,699 B2
(45) Date of Patent: Jun. 24, 2008

(54) INTEGRATED CIRCUIT DIE CONNECTION METHODS AND APPARATUS

(75) Inventor: Stephen Ellwood, Cambridge (GB)

(73) Assignee: Artimi Ltd., Cambridge, Cambridgeshire (GB)

( * ) Notice: Subject to any disclaimer, the term of this patent is extended or adjusted under 35 U.S.C. 154(b) by 330 days.

(21) Appl. No.: 11/110,958

(22) Filed: Apr. 21, 2005

(65) Prior Publication Data
US 2006/0166399 A1 Jul. 27, 2006

(30) Foreign Application Priority Data
Jan. 21, 2005 (GB) ................... 0501210.9

(51) Int. Cl.
H01L 21/50 (2006.01)
H01L 21/48 (2006.01)
H01L 21/44 (2006.01)
H01L 23/34 (2006.01)
H01L 23/52 (2006.01)
H01L 23/48 (2006.01)
H01L 23/40 (2006.01)

(52) U.S. Cl. .................. 438/107; 438/106; 257/728; 257/723; 257/724; 257/784

(58) Field of Classification Search ............. 438/107, 438/106; 257/728, 723, 724, 784
See application file for complete search history.

(56) References Cited

U.S. PATENT DOCUMENTS

| 6,472,747 | B2 * | 10/2002 | Bazarjani et al. ........... 257/724 |
| 6,580,163 | B2 * | 6/2003 | Poulin ....................... 257/678 |
| 6,952,573 | B2 * | 10/2005 | Schucker et al. ........... 455/333 |
| 2002/0121679 | A1 | 9/2002 | Bazarjani |
| 2003/0183927 | A1 | 10/2003 | Kojima |
| 2003/0214052 | A1 | 11/2003 | Poulin |
| 2004/0075170 | A1 | 4/2004 | Degani et al. |

FOREIGN PATENT DOCUMENTS

EP 0596596 3/1997

OTHER PUBLICATIONS

United Kingdom Search Report from UK Appl. No. GB0513311.1, 1 page, Dated Aug. 4, 2005.
United Kingdom Search Report from UK Appl. No. GB0501210.9, 1 page, Dated Jun. 23, 2005.

* cited by examiner

Primary Examiner—Luan Thai
(74) Attorney, Agent, or Firm—Sterne, Kessler, Goldstein & Fox P.L.L.C.

(57) ABSTRACT

This invention generally relates to methods and apparatus for connecting to an integrated circuit die, in particular where the die includes both analogue/microwave radio frequency (rf) circuitry and digital circuitry. A method of connecting a die having both microwave radio frequency (rf) circuitry and digital circuitry to a substrate of a package for the die, the die having a plurality of bond pads, some for said rf circuitry and some for said digital circuitry, the substrate having a plurality of interconnects for making external connections to said package and a plurality of substrate pads for connecting said interconnects to said die, the method comprising: connecting at least one of said bond pads for said rf circuitry to a substrate pad by connecting said rf bond pad to an intermediate substrate and connecting said intermediate substrate to said substrate pad. Preferably at least some of the bond pads for the digital circuitry are directly connected to the substrate pads, for example by wire bonding.

6 Claims, 6 Drawing Sheets

US 7,390,699 B2

INTEGRATED CIRCUIT DIE CONNECTION METHODS AND APPARATUS

BACKGROUND OF THE INVENTION

1. Field of the Invention

This invention generally relates to methods and apparatus for connecting to an integrated circuit die, in particular where the die includes both analogue/microwave radio frequency (rf) circuitry and digital circuitry.

2. Background Art

One of the commonest methods of making connections from an integrated circuit die to an underlying package substrate bearing external interconnects for the integrated circuit is by means of wirebonding. With this technique a fine bond wire, typically of gold or aluminium, is used to connect a pad on the die to a pad on the package (or interconnect) substrate.

FIGS. 1a and 1b show a vertical cross-section and a view from above of a typical wirebonded integrated circuit 10 in which the die 12 is mounted on a ball grid array (BGA) substrate 14. Die pads 12a are connected to substrate pads 14a by means of a plurality of wirebonds 16 (omitted for clarity in the view from above), the substrate pads 14a being connected to solderballs 14b, which are arranged in a matrix, by meandering tracks (not shown). Typically the package substrate has four or more (conducting) layers to provide ground planes for impedance control as well as a sufficient number of layers for routing the tracks. Substrates may be fabricated from a variety of materials but typically organic (plastic) materials are employed, for example glass fibre with BT (bismalemide triazine) or FR-4/5 resin or polyimide. The die 12 is generally attached to substrate 14 by means of adhesive or underfill 18, typically epoxy. After wirebonding the die is encapsulated, typically using a glob top process.

Wirebonding techniques, although relatively popular and inexpensive, suffer from problems at higher frequencies, in particular microwave frequencies above 1 GHz because of the bond wire inductance. This can result in the bond wire having an undesirably high impedance at these frequencies. In particular the inductance of the bond wire forms a π-filter (C-L-C filter) with the capitance of the die bond pad 12a and the capitance of the package substrate, in particular the substrate pad 14a, as shown in FIG. 1c. A typical bond wire has a length of around 800 µm and conventional bondwire has an inductance of around 1 nH per millimetre of length so that the inductance of a typical bondwire is around 800 pH (an impedance, from the wire alone, of around 50 ohms). The π filter of FIG. 1c produces a low pass response with a typical cut-off frequency in the range 1 GHz to 10 GHz, which is a problem for many single chip mixed signal (digital and rf) devices, particularly as the rf operating frequencies increase above 1 GHz.

It is desirable to be able to reduce the length of a bond wire 16 to reduce the inductance and hence push the low pass filter cut off frequency above the relevant band of interest, but conventional methods of connecting to a die make this difficult. Referring again to FIG. 1, adhesive 18 forms a meniscus 20 which restricts how close substrate pads 14a can be placed to the die 12, hence restricting the minimum length of a bond wire 16. Moreover because the pitch of the die bond pads 12a is generally smaller than the minimum pitch of the substrate pads 14a, for example 70 µm as opposed to 100 µm, the bond wires are frequently fanned out beyond the perimeter of the die 12, as illustratively shown by dashed line 22 in FIG. 1b.

It is known to mount a microwave integrated circuit in a cavity on a ceramic substrate to reduce the length of the bond wires, but this is expensive. Cavity-down BGA's where the chip (die) is mounted in a cavity in the underside of substrate 14, on a copper heat sink, are also known. The skilled person will be aware that a number of other chip packaging techniques are also available including flip-chip techniques (which have no bonding wires) and the so-called Sea of Leads (SoL) package (a variant on flip-chip with short, compliant chip interconnections). Another approach is to separate the rf and digital circuitry into two separate chips, but this has the disadvantage of requiring many connections between the two chips, which is expensive.

BRIEF SUMMARY OF THE INVENTION

According to a first aspect of the present invention there is therefore provided a method of connecting a die having both microwave radio frequency (rf) circuitry and digital circuitry to a substrate of a package for the die, the die having a plurality of bond pads, some for said rf circuitry and some for said digital circuitry, the substrate having a plurality of interconnects for making external connections to said package and a plurality of substrate pads for connecting said interconnects to said die, the method comprising: connecting at least one of said bond pads for said rf circuitry to a substrate pad by connecting said rf bond pad to an intermediate substrate and connecting said intermediate substrate to said substrate pad.

Embodiments of this method provide a number of advantages, including a relatively low cost method of providing a reduction in bond wire length. Other embodiments of the method additionally or alternatively provide rf signal paths having a more readily controllable impedance, and a reduction in the number of layers required for the package substrate. Preferably the majority or substantially all of the analogue rf/microwave connections are made through the intermediate substrate; the digital circuitry may be directly connected to the substrate in a conventional manner, for example by wirebonding, tape automated bonding (TAB) or the like.

In preferred embodiments of the method the intermediate substrate is mounted on the package substrate such that a height above the package substrate of a portion of the intermediate substrate to which an rf bond pad connects substantially matches a height of the bond pad above the package substrate when the die is mounted on the package substrate (the method generally including mounting the die on the package substrate). Preferably therefore (depending upon how the intermediate substrate is mounted on the package substrate) a height or thickness of the intermediate substrate approximately matches a height or thickness of the die. Preferably the intermediate substrate is substantially adjacent the die to minimise bond wire length.

Preferably the intermediate substrate is configured to provide a controlled impendence pathway from an rf bond pad to a substrate pad, preferably along substantially the whole length of such a connection. For example, in one embodiment a bond pad connection may be taken down through a via to the underside of the intermediate substrate (that is to the surface of the intermediate substrate closest to the package substrate) and then run along a track on this surface to a connection to a substrate pad, this environment for the track being more readily characterisable than that of an upper side of the intermediate substrate over which glob top will be applied. In other embodiments the intermediate substrate has three or more (conducting) layers so that a track may be run within the intermediate substrate, particularly preferably adjacent a ground plain or between a pair of ground plains. In this way the rf tracks may be effectively configured as transmission lines. It will be appreciated that the intermediate substrate need not provide a connection all the way from a die bond pad to a substrate pad it is preferable that at least the majority of the track length, more preferably substantially all the track length, is implemented in the intermediate substrate for improved impendence control. Furthermore, this allows a cheaper two layer package substrate to be used rather than the four layer substrate which would otherwise be needed (to provide ground planes).

Preferably the intermediate substrate is formed from a fired aluminia ceramic, but one particularly preferred material is LTCC (low temperature co-fired ceramic), which has low tan δ losses and a high and well-controlled dielectric constant, which facilitates thinner tracks of well-characterised impedance. However other materials such as HTCC (high temperature co-fired ceramic) or glass fibre-based materials such as FR4 may also be employed.

Preferably embodiments of the method include shaping the intermediate substrate so that a portion of its perimeter substantially matches a portion of the perimeter of the die. In particular, since there is generally a great deal more digital than rf circuitry the die may be configured so that the rf circuitry occupies one corner of the die, in which case the intermediate substrate can be shaped so that it fits around this corner of the die (i.e. approximately L-shaped). This leaves a portion of the perimeter of the die available for making conventional wire bonded connections from the package substrate directly to bond pads for the digital circuitry. Fabricating the intermediate substrate from co-fired ceramic facilitates this shaping process since the material prior to firing ("green tape") may simply be stamped or punched in to the desired shape, which is much cheaper than, say, the milling procedure which would be needed for glass fibre. Using LTCC facilitates the fabrication of tracks from low (ohmic) loss materials such as gold or silver (for HTCC materials the more resistive tungsten would generally be needed).

Preferably the intermediate substrate has a plurality of first contacts for connecting to the die bond pads and a plurality of second contacts for connecting to the substrate pads, as previously described.

According to a second aspect of the invention there is therefore provided a device for connecting a die having both microwave radio frequency (rf) circuitry and digital circuitry to a substrate of a package for the die, the die having a plurality of bond pads, some for said rf circuitry and some for said digital circuitry, the substrate having a plurality of interconnects for making external connections to said package and a plurality of substrate pads for connecting said interconnects to said die, the device comprising an intermediate substrate, said intermediate substrate having a plurality of first contacts for connecting to said bond pads and a plurality of second contacts for connecting to said substrate pads, ones of said first contacts being connected to ones of said second contacts.

Preferably substantially all the first contacts are adjacent a periphery of the intermediate substrate, to minimise the rf wirebonding distance required. Generally the first contacts will comprise wirebonding pads but a range of technologies is available for the second contacts including metal (for example solder or gold) bumps or balls and off-surface leads, pins, springs or the like. Preferably the second contacts provide a degree of compliance to allow for a co-efficient of thermal expansion mismatch between the intermediate substrate and the package substrate. Metal pins (as described later) are particularly preferable as they are also able to space the intermediate substrate away from the package substrate a distance approximately equal to the thickness of the adhesive attaching the die (meniscus height) so that the heights of the intermediate substrate and die substantially correspond, although other means may also be employed to achieve this.

The invention also provides an integrated circuit comprising: a die including at least analogue rf circuitry and a plurality of bond pads for connecting to said analogue rf circuitry; an interconnect on substrate which said die is mounted, the interconnect substrate having a plurality of interconnects for making connections to the integrated circuit and a plurality of substrate pads for connecting said interconnects to said die bond pads; and an intermediate substrate mounted on said interconnect substrate adjacent said die; and wherein one or more of said bond pads for connecting to said rf circuitry are connected to one or more said substrate pads through said intermediate substrate.

Preferably the rf circuitry comprises microwave circuitry, that is circuitry configured to operate at a frequency of 1 GHz or higher. In embodiments 5 GHz or higher or up to 10 GHz or more. Preferably the height of the intermediate substrate above the interconnect substrate (also previously referred to as the package substrate) substantially matches the height of the die.

Preferably the intermediate substrate has first contacts for connecting to the die bond pads and second contacts for connecting to the substrate pads, at least one of the first contacts being connected to at least one of the second contacts by a controlled impedance track such as a (balanced or unbalanced) transmission line. Depending upon the number of layers of the intermediate substrate such a transmission line may comprises microstrip (one ground plane), stripline (between two ground planes), co-planar wave guide (two ground planes with a line within one of them), balanced line (optionally with no ground planes) or some other transmission line configuration.

Preferably the first contacts of the intermediate substrate are connected to the die bond pads by wirebonding using single or double tape (i.e. rectangular section wire) to provide increased surface area since at microwave frequencies the rf signal travels mainly in the surface of a conductor. There are broadly two types of wirebonding, ball bonding in which a ball is formed at the end of the wire to be bonded and the bonded wire is attached approximately perpendicularly to a pad, and wedge bonding in which the bonded wire is attached at a reduced angle, generally less than 45°, to a bond pad. Preferably the wire bond connections from the die bond pads to the intermediate substrate first contact bond pads are wedge bonded at both ends to further reduce the length of wirebonding required. However in other embodiments techniques other than wirebonding may be employed to connect the die to the intermediate substrate, for example tape automated bonding (TAB).

The package or interconnect substrate may be of any conventional type including a BGA package substrate or one of its many variants such as an LGA (land grid array) or, more generally, any type of single or multi-layer substrate providing external interconnects, such as an organic printed wiring board-based substrate.

BRIEF DESCRIPTION OF THE DRAWINGS/FIGURES

These and other aspects of the invention will now be further described, by way of example only, with reference to the accompanying figures in which.

DETAILED DESCRIPTION OF THE INVENTION

Figure 1A:
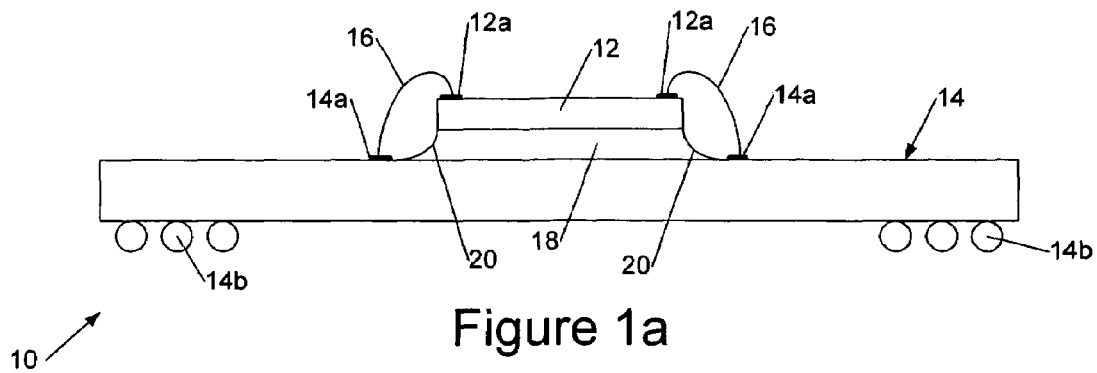
FIGS. 1a to 1d show, respectively, a vertical cross-section and a view from above of a wirebonded integrated circuit, a circuit model of a connection to a die through an IC package, and a block diagram of a UWB receiver suitable for integration as a single chip mixed signal device.
Figure 1B:
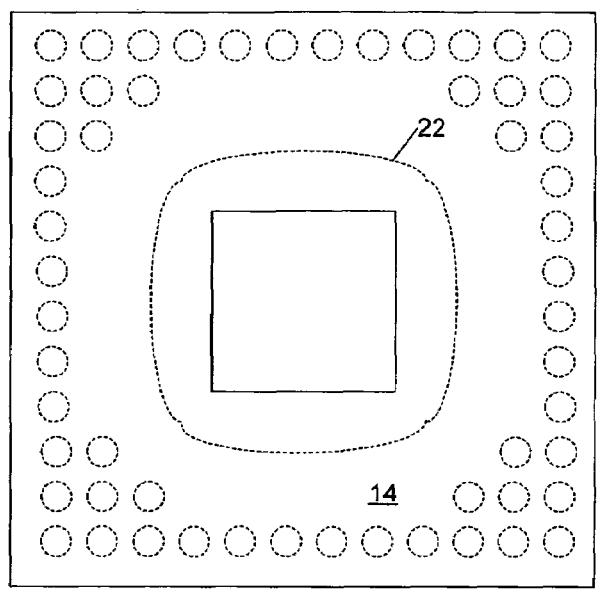
Figure 1C:
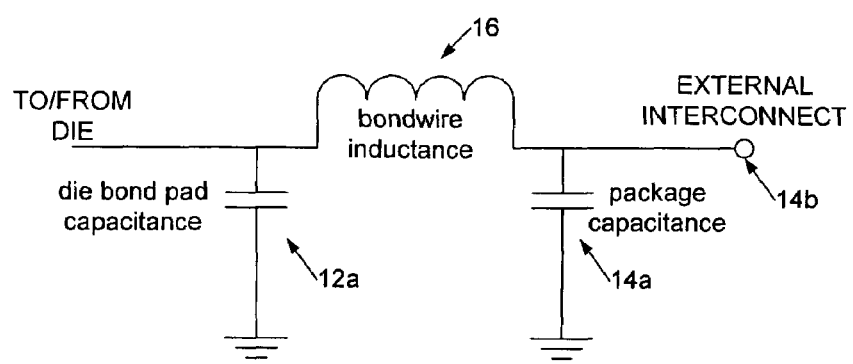
Figure 1D:
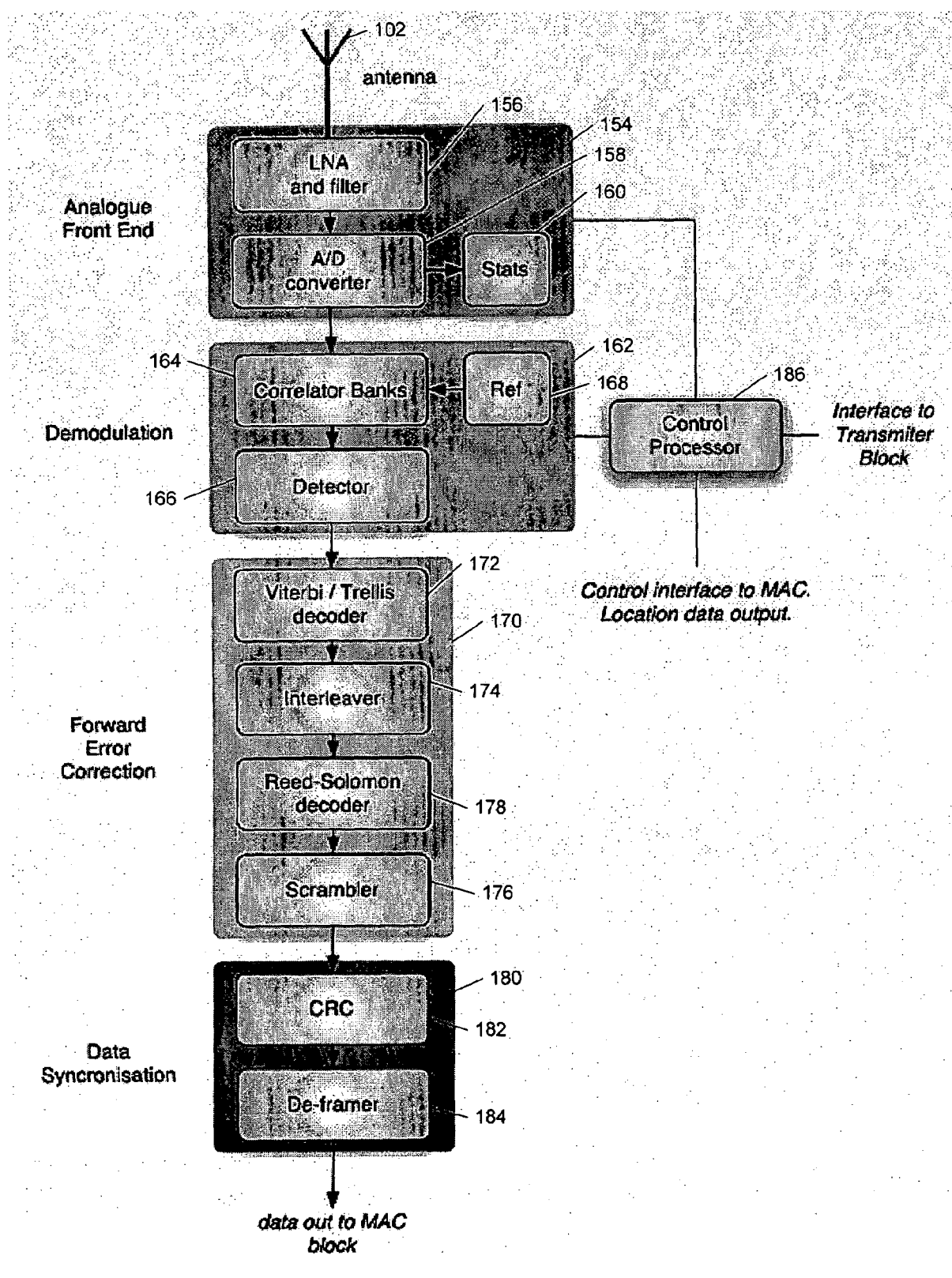

Some preferred embodiments of the invention are useful for connecting to a die for a single chip mixed signal (analogue rf and digital) monolithic device, in particular for a UWB (ultra wideband) receiver, transmitter or transceiver chip. An example of such a device will therefore be briefly outlined with reference to FIG. 1d, which shows a block diagram of a UWB receiver 150.

An incoming UWB signal is received by (off-chip) antenna 102 and provided to analog front end block 154 which comprises a low noise amplifier (LNA) and filter 156, and an analogue-to-digital converter 158. A set of counters or registers 160 is also provided to capture and record statistics relating to the received UWB input signal. The analog front end 154 is primarily responsible for converting the received UWB signal into digital form.

The digitised UWB signal output from front end 154 is provided to a demodulation block 162 comprising a correlator bank 164 and a detector 166. The digitised input signal is correlated with a reference signal from a reference signal memory 168 which discriminates against noise and the output of the correlator is then fed to the detector which determines the n (where n is a positive integer) most probable locations and phase values for a received pulse.

The output of the demodulation block 162 is provided to a conventional forward error correction (FEC) block 170. In one implementation of the receiver FEC block 170 comprises a trellis or Viterbi state decoder 172 followed by a (de) interleaver 174, a Reed Solomon decoder 176 and (de) scrambler 178. In other implementations other codings/decoding schemes such as turbo coding may be employed.

The output of FEC block is then passed to a data synchronisation unit 180 comprising a cyclic redundancy check (CRC) block 182 and de-framer 184. The data synchronisation unit 180 locks onto and tracks framing within the received data separating MAC (Media Access Control) control information from the application data stream(s) providing a data output to a subsequent MAC block (not shown).

A control processor 186 comprising a CPU (Central Processing Unit) with program code and data storage memory is used to control the receiver. The primary task of the control processor 186 is to maintain the reference signal that is fed to the correlator to track changes in the received signal due to environmental changes (such as the initial determination of the reference waveform, control over gain in the LNA block 156, and on-going adjustments in the reference waveform to compensate for external changes in the environment).

Figure 2A:
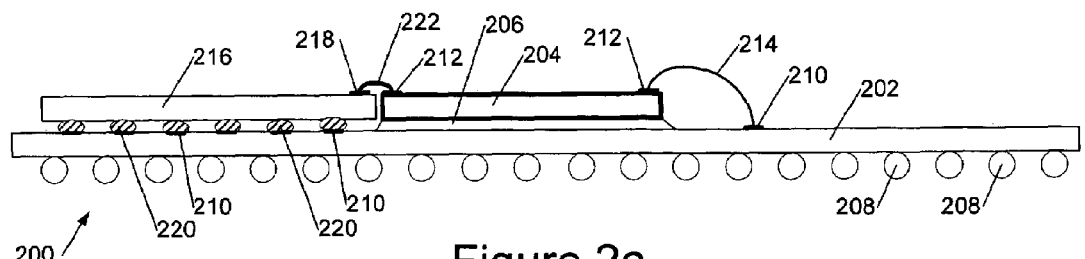
FIGS. 2a to 2c show, respectively, a vertical cross-sectional and a view from above of an integrated circuit including an LTCC insert according to an embodiment of the present invention, and a detailed view of a portion of FIG. 2b.
Figure 2B:
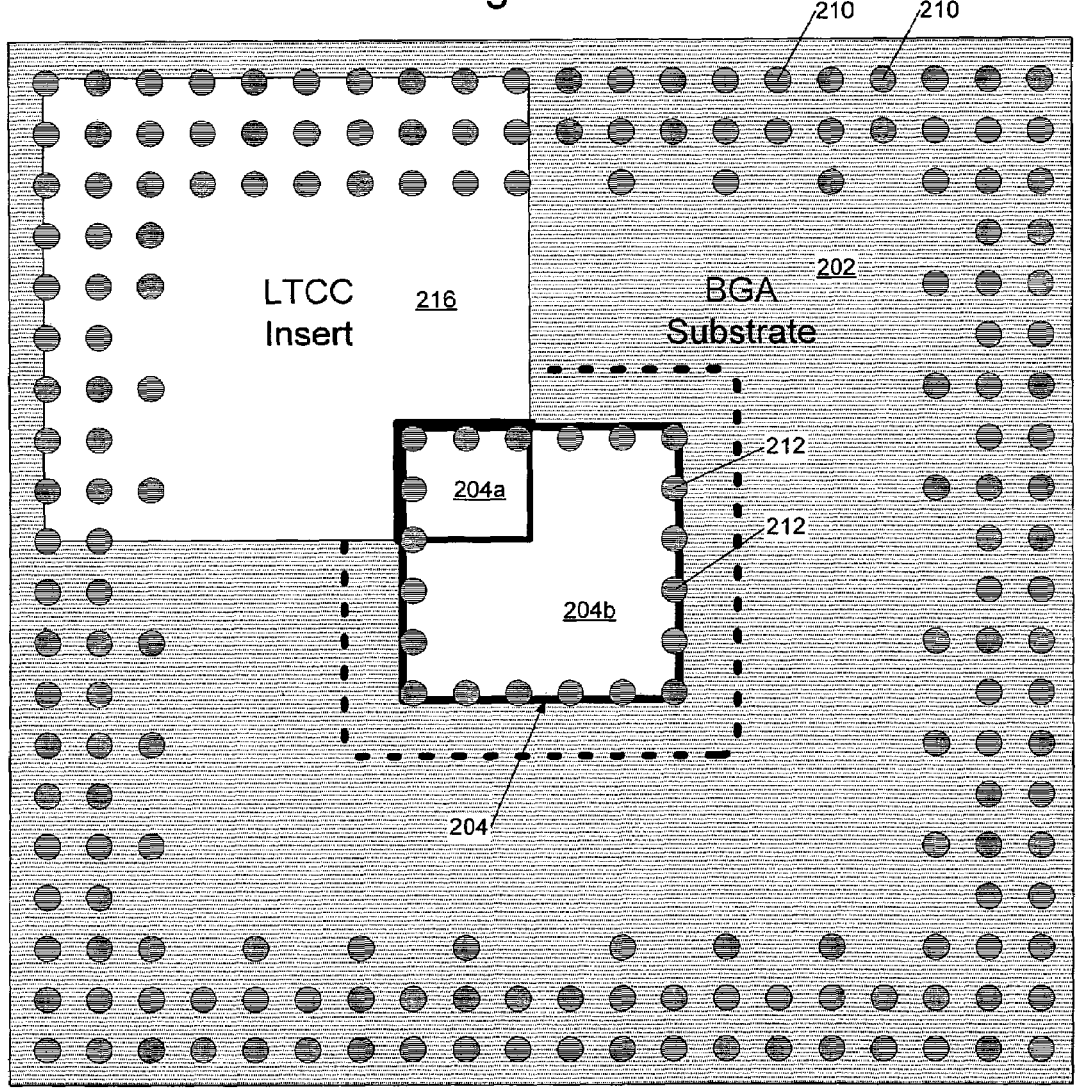

Referring now to FIGS. 2a and 2b, these show a vertical cross-section through and view from above of an integrated circuit 200 prior to encapsulation, embodying aspects of the present invention. The IC 200 comprises a two layer ball grid array (BGA) substrate 202 on which is mounted a mixed signal die 204, attached by means of adhesive 206. The die 204 has two relatively distinct portions, a first portion 204a comprising rf circuitry and a second portion 204b comprising digital circuitry. The die is preferably fabricated from silicon although other materials such as gallium arsenide (GaAS) may also be employed.

The package substrate 202 has a plurality of external interconnects 208, in this example solder balls, and corresponding plurality of substrate (bond) pads 210 for making connections to the external interconnects. The die 204 has a plurality of die pads 212 for making connections to the rf and digital circuitry 204a, b. Connections to the digital circuitry are made using conventional bond wire 214 but connections to the rf circuitry are made via an LTCC (low temperature co-fired ceramic) insert 216. This LTCC insert has a plurality of wirebond pads 218 for making wirebonded connections to die 204, and a plurality of second contacts 220, in the illustrated example shown as solder ball-type contacts, making connection to the substrate pads 210.

This arrangement enables the use of a shorter-than-normal bondwire 222 for connecting a die bond pad 212 to an LTCC insert bond pad 218, the remainder of the connection to a substrate pad 210 preferably being made by means of a controlled impendence line running on or within insert 216. Preferably the insert 216 is placed substantially adjacent the die 204 and has a substantially matching height. For example, in embodiments the gap between the insert and the die is of order of 100 μm, which allows the bond wire length to be reduced to between 120 μm and 150 μm, thus reducing the inductance of the bondwire to 200 pH or less and pushing the cut off frequency of the low pass filter of FIG. 1c above the band of interest (above 10 GHz).

Typically, as shown, the rf circuitry will occupy just a corner of die 204 and preferably therefore the LTCC insert 216 is approximately L-shaped, fitting around this corner. This shape can be easily fabricated in low or high temperature co-fired ceramic material by cutting the green tape to the required shape prior to firing. The insert 216 can be positioned by a standard die placement machine since, to the machine, the insert is just another die.

Figure 2C:
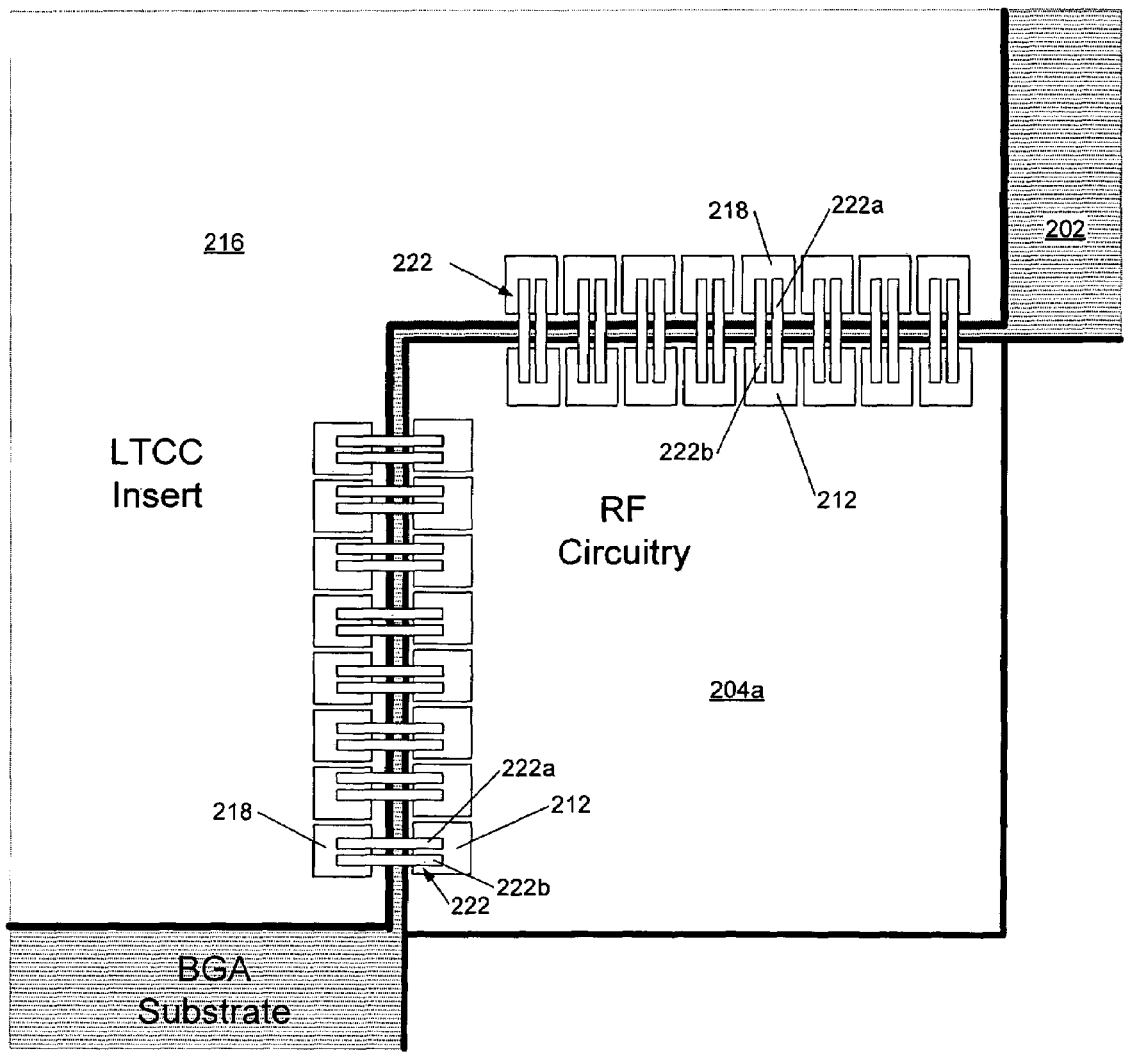

Referring now to FIG. 2c, this shows an enlarged portion of the arrangement of FIG. 2b, in which like elements are indicated by like reference numerals. Here it can be seen that the bond wires 222 of this embodiment comprise double tape 222a, b. Conventional 25 μm gold wire is relatively inexpensive but has a low surface area, which impedes the transmission of energy at microwave frequencies (which propagates in the surface of a conductor). It is therefore preferable to use tape or ribbon which provides a larger surface area—for example 30 μm by 12 μm or 45 μm by 25 μm rectangular cross-section tape may be employed. At higher rf frequencies double tape may be employed (as shown) to provide twice the surface area.

Figure 3A:
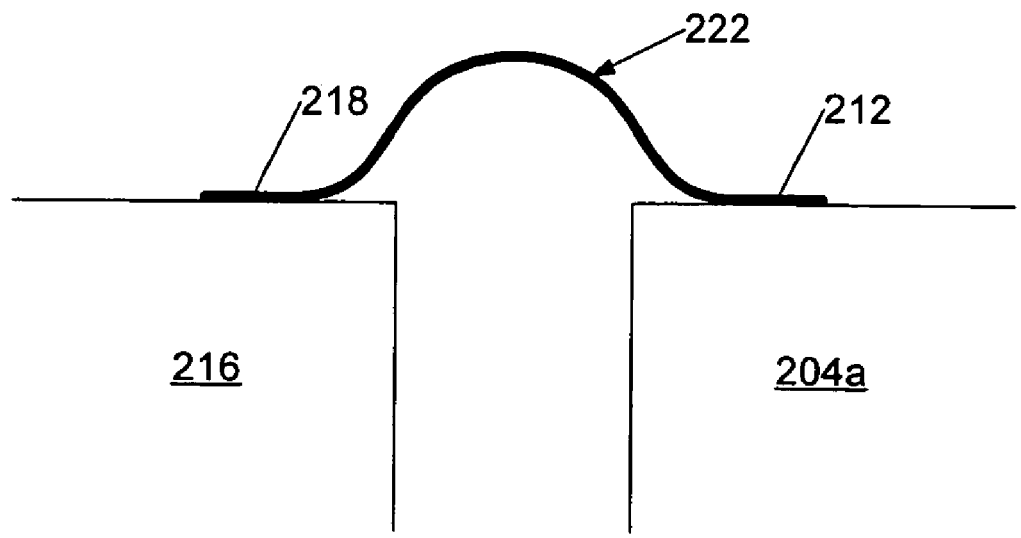
FIGS. 3a and 3b show a wirebonded connection between a die and the LTCC insert of FIG. 2, and a connection between the LTCC insert and an underlying package substrate.

FIG. 3a shows such a bond wire 222 in cross section, showing the preferred "wedge" method of wirebonding which, because of its reduced angle to a bond pad, helps to minimise the length of the bond wire.

Figure 3B:
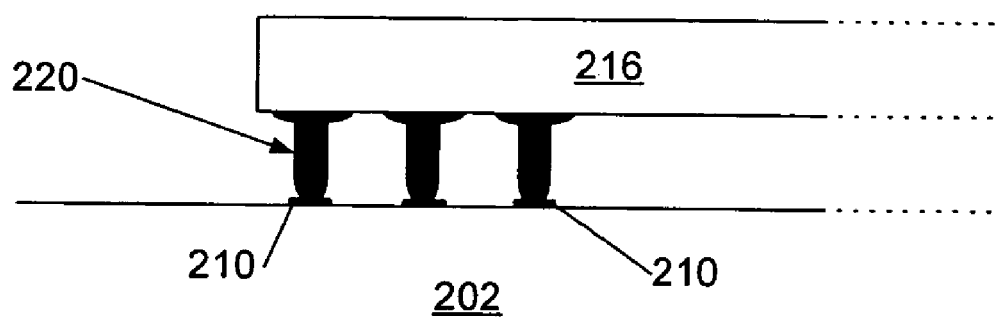

The connections between the LTCC insert 216 and the substrate 202 may be made by solder balls, using a reflow technique in a similar way to flip chip technology. However FIG. 3b shows an alternative, preferred embodiment for the contacts 220 between the insert 216 and package interconnect substrate 202, in which the contacts comprise pins which help in matching the height of the insert 216 to the height of the die 204, and which also allow for some differential thermal expansion between insert 216 and substrate 202. Suitable pins are the so-called μPost™ technology available from Mintech Interconnect and Test Division, Norwich, UK which provide a height up to 250 μm, a diameter up to 65 μm, and minimum pitch of 80 μm and which require a minimum pad size of 30 μm. Such pins may be attached to the substrate pads 210 by a variety of methods including (but not limited to) thermosonic, epoxy, ultrasonic, solder, and therrnocompression methods.

Referring now to FIG. 4, this shows examples of some preferred controlled impedance connections between contacts 218 and 220 of insert 216. In the example of FIG. 4*a* bond pad 218 connects directly to a via 400 and thence to a track 402 running on the underside of the insert to provide a well characterised impedance. In the example of FIG. 4*b* the insert 216 has three rather than two conducting layers and a via 404 from pad 218 connects to a track 406 running on an interior layer of insert 216 between a pair of ground planes 408*a, b* (which need not be complete) formed by outer layers of the insert.

Figure 4A:
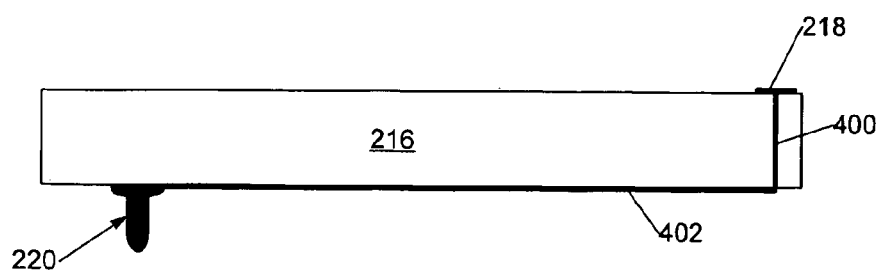
FIGS. 4a to 4F show, respectively, first and second examples of rf transmission lines for the LTCC insert of FIG. 2, and microstrip, stripline, co-planar waveguide, and balanced line structures for the LTCC insert.
Figure 4B:
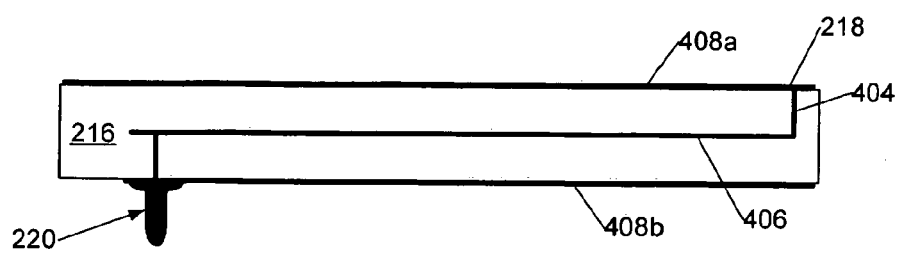
Figure 4C:
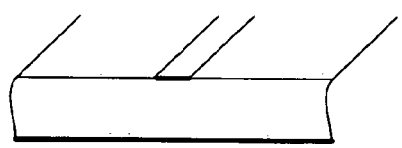
Figure 4D:
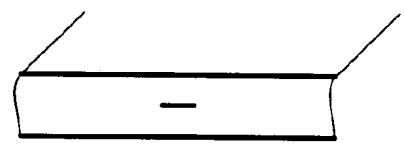
Figure 4E:
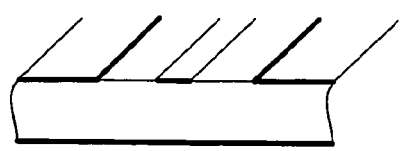
Figure 4F:
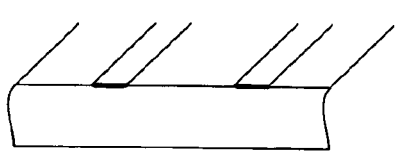

FIGS. 4*c* to 4*f* show some examples of controlled impedance lines which may be employed with the configurations of FIGS. 4*a* and 4*b*. More particularly FIG. 4*c* shows a microstrip structure, FIG. 4*d* a stripline structure, FIG. 4*e* a co-planar waveguide structure, and FIG. 4*f* a balanced line structure. Suitable dimensions for specific structures, for example for UWB, may be determined by conventional means well known to those skilled in the art taking account of the dimensions and characteristics of the insert 216 and the desired frequency or frequencies of operation. For further details reference may be made to a reference book such as Foundations of Interconnect and Microstrip Design by T. C. Edwards and M. B. Steer, John Wiley & Sons.

Where only a single ground plane is employed as shown in FIG. 4*a* preferably track 402 runs along the underside of the insert 216 (that is closest to interconnect substrate 202, since this environment is more controllable and better characterised than the upper surface of insert 216 which is generally covered by plastic encapsulant ("glob top").

No doubt many other effective alternatives will occur to the skilled person. It will be understood that the invention is not limited to the described embodiments and encompasses modifications apparent to those skilled in the art lying within the spirit and scope of the claims appended hereto.

What is claimed is:

1. A method of connecting a die having both microwave radio frequency (rf) circuitry and digital circuitry to a substrate of a package for the die, the die having a plurality of bond pads, some for said rf circuitry and some for said digital circuitry, the substrate having a plurality of interconnects for making external connections to said package and a plurality of substrate pads for connecting said interconnects to said die, the method comprising:

connecting at least one of said bond pads for said rf circuitry to a substrate pad by connecting said rf bond pad to an intermediate substrate and connecting said intermediate substrate to said substrate pad; and mounting said intermediate substrate on said package substrate such that a height above said package substrate of a portion of said intermediate substrate to which said rf bond pad connects substantially matches a height of said rf bond pad above said package substrate when said die is mounted on said package substrate.

2. A method as claimed in claim 1, comprising connecting at least some of said bond pads for said digital circuitry to said substrate pads by wirebonding.

3. A method as claimed in claim 1, further comprising configuring said intermediate substrate to provide a controlled impedance pathway from said rf bond pad to said substrate pad.

4. A method as claimed in claim 1, wherein said package substrate has less than four conducting layers.

5. A method as claimed in claim 1, wherein said intermediate substrate has a plurality of first contacts for connecting to said bond pads and a plurality of second contacts for connecting to said substrate pads, ones of said first contacts being connected to ones of said second contacts, and wherein said connecting comprises connecting an rf bond pad to a first contact by wirebonding and connecting a second contact to which the first contact is connected to a substrate pad.

6. A method of connecting a die having both microwave radio frequency (rf) circuitry and digital circuitry to a substrate of a package for the die, the die having a plurality of bond pads, some for said rf circuitry and some for said digital circuitry, the substrate having a plurality of interconnects for making external connections to said package and a plurality of substrate pads for connecting said interconnects to said die, the method comprising:

connecting at least one of said bond pads for said rf circuitry to a substrate pad by connecting said rf bond pad to an intermediate substrate and connecting said intermediate substrate to said substrate pad; and shaping said intermediate substrate such that a corner portion of the perimeter of said intermediate substrate substantially matches a corner portion of the perimeter of said die, and placing said intermediate substrate and said package substrate such that their matching perimeter portions are substantially adjacent to one another.

* * * * *